(12) United States Patent
Kim (10) Patent No.: US 6,359,481 B1
(45) Date of Patent: Mar. 19, 2002

(54) DATA SYNCHRONIZATION CIRCUIT

(75) Inventor: Kyu-hyoun Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/718,158

(22) Filed: Nov. 22, 2000

(30) Foreign Application Priority Data

Nov. 22, 1999 (KR) ............................................. 99-51875

(51) Int. Cl.$^7$ .............................. H03K 5/13; H03K 5/00

(52) U.S. Cl. .......................... 327/141; 327/34; 327/551

(58) Field of Search ..................... 327/34, 551, 141, 327/165, 166, 291, 292

(56) References Cited

U.S. PATENT DOCUMENTS 5,386,159 A * 1/1995 Dupre ........................ 327/551
5,510,740 A * 4/1996 Farrell et al. ................ 327/141

OTHER PUBLICATIONS

Kim et al., A 65–Mbit, 640–Mbyte/s Bidirectional Data Strobed, Double–Data–Rate SDRAM With a 40–mW DLL for a 256–Mbyte Memory System, IEEE Journal of Solid-–State Circuits, vol. 33, No. 11, Nov. 1998, pp. 1703–1710.

* cited by examiner

*Primary Examiner*—Dinh T. Le
(74) *Attorney, Agent, or Firm*—Myers Bigel Sibley & Sajovec

(57) ABSTRACT

Integrated circuit memory devices include a data synchronization circuit that includes a modulator, a pulse width filter and a demodulator. The circuit is configured to generate a filter input signal as a first pulse train having pulses of nonequivalent widths, in response to a first clock signal and a data input signal that is out of phase relative to the first clock signal. The circuit is further configured to filter the filter input signal and generate a filter output signal as a second pulse train. The circuit generates a data output signal as a true or complementary time corrected version of the data input signal, in response to the filter output signal and a second clock signal. Accordingly, the data is synchronized with a clock signal without requiring the use of a transmission clock signal Tclk and a reception clock signal Rclk, or a data strobe signal.

27 Claims, 8 Drawing Sheets

DATA SYNCHRONIZATION CIRCUIT

RELATED APPLICATION

This application is related to Korean Application No. 1999-51875, filed Nov. 22, 1999, the disclosure of which is hereby incorporated herein by reference.

FIELD OF THE INVENTION

The present invention relates generally to integrated circuit, and more particularly to synchronization of integrated circuits that operate in response to a clock signal.

BACKGROUND OF THE INVENTION

Synchronous dynamic random access memories (DRAMs) are widely used in the area of integrated circuits. A synchronous DRAM inputs data into a memory cell or outputs data from a memory cell during a valid data window in synchronization with a clock signal. As the clock frequency increases, the time difference or phase difference between the clock signal and the data signal (hereafter "skew") may not decrease, but the valid data window may.

Skew may be caused by the delay within the synchronous DRAM, the signal transmission time of the printed circuit board (PCB) that the synchronous DRAM is mounted on, or the relative time difference between clock signals used in a memory controller and a synchronous DRAM. Skew may become relatively larger with respect to a decreasing valid data region.

The clock signal may be input through a single pin and then distributed throughout the entire device. Therefore, a clock signal at a portion of the device relatively far away from the input pin may have a large delay compared to a clock signal closer to the input pin. This delay makes it difficult to maintain synchronization among various parts of the synchronous DRAM.

One approach for maintaining synchronization is to implement the connection structure of a clock signal in the same manner as in the connection structure of a data line on a PCB, therefore the clock signal has as much skew as the data line. This approach is based on the idea that a clock signal is transmitted in the same direction as the data transmission, and thus two clock signals, i.e., a transmission clock signal Tclk and a reception clock signal Rclk will be provided. However, this method is disadvantageous because it may be difficult to control the timing between a master clock signal and a transmission clock signal Tclk or a reception clock signal Rclk, and additional circuits may be required to solve this problem, thereby increasing the cost of a device.

Another approach for maintaining synchronization is to implement the bidirectional data strobe method disclosed in an article by Kim et al, entitled *A 64-Mbit, 640-Mbyte/s Bidirectional Data Strobed, Double-Data-Rate SDRAM With a 40-mW DLL for a 256-Mbyte Memory System*, IEEE Journal of Solid State Circuits, Vol. 33, No. 11, November 1998, pp. 1703–1710. According to the bidirectional data strobe method, an additional signal referred to as a data strobe signal may be included in each device and transmitted in the same direction as the data transmission. However, this approach is also disadvantageous because it may be difficult to maintain a synchronous relation between a master clock signal and a data strobe signal. Accordingly, there is a need for an improved approach for synchronizing a data signal with a clock signal.

SIGNAL OF THE INVENTION

Integrated circuit memory devices according to embodiments of the invention include a data synchronization circuit comprising a modulator, a pulse width filter and a demodulator. The circuit is configured to generate a filter input signal as a first pulse train having pulses of nonequivalent widths, in response to a first clock signal and a data input signal that is out of phase relative to the first clock signal. The circuit is further configured to filter the filter input signal and generate a filter output signal as a second pulse train. Finally, the circuit generates a data output signal as a true or complementary time corrected version of the data input signal, in response to the filter output signal and a second clock signal. Accordingly, the data signal is synchronized with a clock signal without requiring the use of a transmission clock signal Tclk and a reception clock signal Rclk, or a data strobe signal.

Other embodiments of the data synchronization circuit include a modulator that generates a filter input signal as a first pulse train having pulses of nonequivalent widths, in response to a first clock signal and a data input signal that is out of phase relative to the first clock signal. A pulse width filter generates a filter output signal as a second pulse train, in response to the filter input signal. Finally, a demodulator generates a data output signal as a true or complementary time corrected version of the data input signal, in response to the filter output signal and a second clock signal.

In embodiments of the invention, the first clock signal and the second clock signal are in phase with each other and the data output signal is in phase with the first and second clock signals.

The pulse width filter includes a delay unit and a filter circuit. The delay unit generates a delayed filter input signal from the filter input signal. The delay unit comprises an inverter chain.

The filter circuit generates the filter output signal from the filter input signal and the delayed filter input signal. The filter circuit comprises a first filtering device that performs a boolean NAND operation on the filter input signal and the delayed filter input signal. A second filtering device performs a boolean OR operation on the filter input signal and the delayed filter input signal. A third filtering device performs a boolean NAND operation on the output of the first filtering device and the output of a fourth filtering device. Finally, the fourth filtering device performs a boolean NAND operation on the output of the second filtering device and the output of the third filtering device. The first filtering device may be a NAND gate, the second filtering device may be an OR gate, and the third and fourth filtering devices may be NAND gates.

The modulator and the demodulator perform a boolean XOR operations, which may be implemented using XOR gates.

According to other circuit embodiments of the present invention, the data synchronization circuit may further include a delay locked loop that generates the first clock signal that is a shifted version of the second clock signal, the first clock signal having a phase that leads the phase of the second clock signal.

The data output signal is in phase with the second clock signal and the pulse width filter comprises a delay unit. The delay provided by the delay unit of the pulse width filter is equivalent to the shift provided by the delay locked loop.

In other embodiments, the second clock signal comprises a delayed version of the first clock signal and edge of the first clock signal is in phase with the midpoint of the data output signal.

The data synchronization circuit further includes a first input buffer, a second input buffer and a delay control circuit.

The first input buffer receives the data input signal and provides the data input signal to the modulator. The second input buffer receives the first clock signal and provides the first clock signal to the modulator, the variable delay unit, and the delay unit. The delay control circuit generates the second clock signal and the control voltage from the first clock signal.

The delay control circuit may include the variable delay unit, the delay unit, the phase detector and the charge pump. The variable delay unit generates the second clock signal in response to the control voltage.

The delay unit generates a delayed version of the first clock signal. The delay unit delays the first clock signal by ¼ of the first clock cycle (Pi/2).

The phase detector generates the control signal in response to the second clock signal and the delayed version of the first clock signal. The phase detector may be realized as a D flip flop.

The charge pump generates the control voltage in response to the control signal. The charge pump may be realized as an integrator. The charge pump may comprise a capacitor that is responsive to the control signal such that the charge pump generates a large control voltage when the control signal is high and generates a small control voltage when the control signal is low.

The pulse width filter includes a delay that is responsive to the control voltage of the charge pump. The delay of the pulse width filter increases as the control voltage decreases and decreases as the control voltage increases.

According to other embodiments of the present invention, the data synchronization circuit may be included in a multi-bank memory device. The multi-bank memory device may include a data bus and a memory controller electrically coupled to the data bus. It may further include a first memory bank electrically coupled to the data bus at a first point thereon. The first memory bank may comprise a data synchronization circuit that is responsive to a global clock signal and a second memory bank electrically coupled to said data bus at a second point thereon.

DETAILED DESCRIPTION OF THE INVENTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
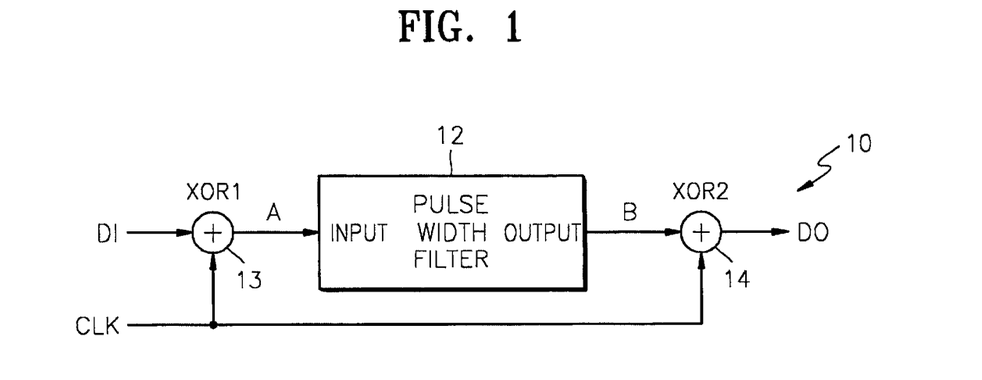
FIG. 1 is a schematic block diagram of a data synchronization circuit according to an embodiment of the present invention.

Referring now to FIG. 1, an embodiment of a data synchronization circuit 10 according to the present invention will be described. As shown in FIG. 1, the data synchronization circuit 10 may include a modulator 13, a pulse width filter 12, and a demodulator 14. The data synchronization circuit synchronizes a data input signal D1 with a clock signal CLK to provide a data output signal DO that is a corrected version of the data input signal D1. The data input signal D1 may have a phase that either leads or lags the phase of the clock signal CLK. It is understood by those having skill in the art that the data output signal DO may be an inverted version of the data input signal D1 and still be a corrected version of the data input signal D1.

The modulator 13 receives the data input signal D1 and the clock signal CLK and generates a filter input signal INPUT at Node A. The filter input signal INPUT may have the form of a pulse train having pulses of multiple widths. Although the modulator is shown as an XOR gate in FIG. 1, other devices capable of modulating a data signal and clock signal in accordance with the techniques described herein may also be used. For example, the modulator function can be implemented using another device or combination of devices that perform a boolean XOR or XNOR operation.

The pulse width filter 12 receives the filter input signal INPUT from the modulator 13 and generates a filter output signal OUTPUT. The pulse width filter passes pulses having a pulse width equal to or greater than a predetermined width and blocks pulses having a pulse width less than the predetermined width, thus generating a filter output signal OUTPUT in the form of a pulse train that includes only the passed pulses.

Figure 2:
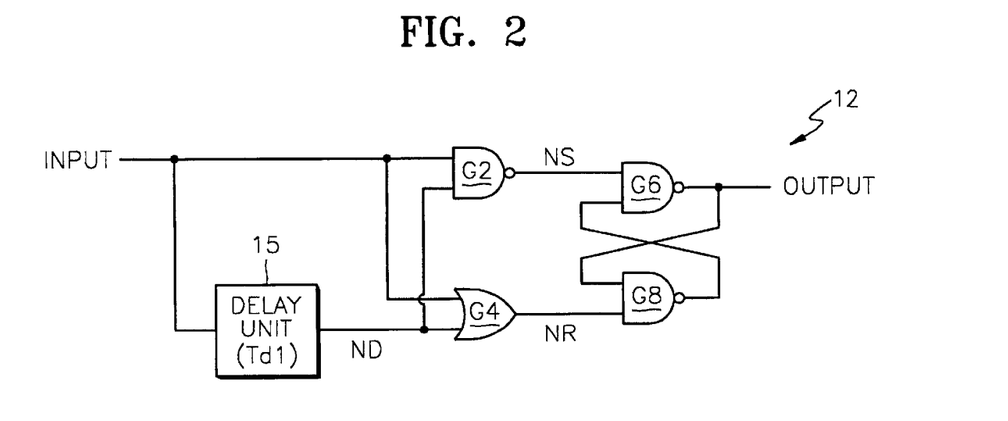
FIG. 2 is a schematic block diagram illustrating the pulse width filter of the data synchronization circuit shown in FIG. 1.

Referring now to FIG. 2., the pulse width filter 12 of the data synchronization circuit 10 shown in FIG. 1 will be described. The pulse width filter 12 may include a delay unit 15 and a filter circuit. The delay unit 15 delays the filter input signal INPUT by a predetermined delay time Td1. The filter circuit receives the filter input signal INPUT and the output of the delay unit 15 (at node ND) and generates the filter output signal OUTPUT.

Still referring to FIG. 2, the filter circuit may comprise three 2-input NAND gates (G2, G6, and G8) and one 2-input OR gate G4. It will be understood by those having skill in the art that although the filter circuit is shown comprising three NAND gates and one OR gate in FIG. 2, other logic gates may also be used. The gates are connected as shown in FIG. 2. The 2-input NAND gate G6 forwards the filter output signal OUTPUT to the demodulator 14.

The filter input signal INPUT is delayed by the delay time Td1 of the delay unit 15 and output to the node ND. The delay unit 15 may be realized as an inverter chain, therefore resulting in a fixed delay time Td1. Table 1 shows the logic states of the nodes of the pulse width filter 12 in FIG. 2 according to the filter input signal INPUT and the logic states of the node ND.

TABLE 1

| INPUT | ND | NS | NR | OUTPUT |
|-------|----|----|----|--------|
| 0 | 0 | 1 | 0 | 1 |
| 0 | 1 | 1 | 1 | Hold |
| 1 | 0 | 1 | 1 | Hold |
| 1 | 1 | 0 | 1 | 1 |

Figure 3:
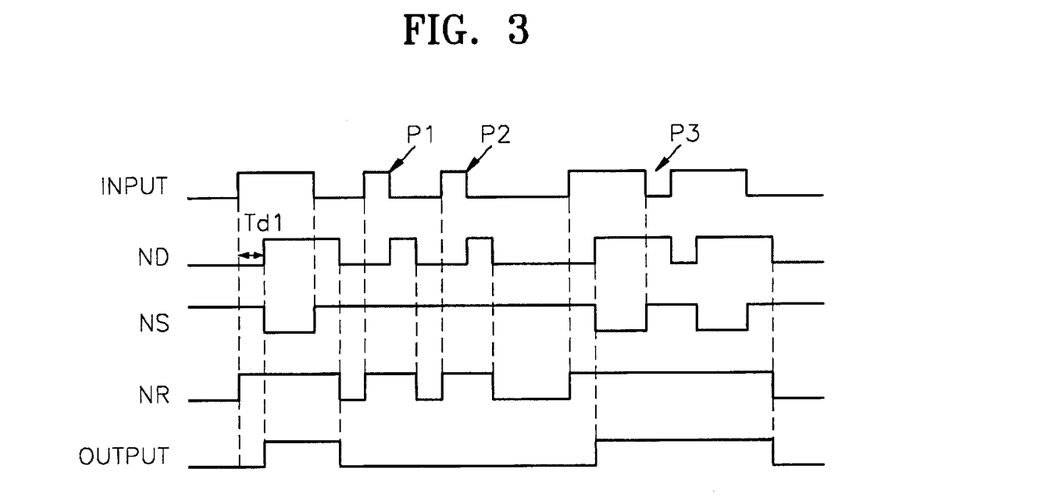
FIG. 3 is a timing diagram illustrating the operation of the pulse width filter shown in FIG. 2.

Now referring to FIG. 3, a timing diagram illustrating the operation of the pulse width filter shown in FIG. 2 will be described in relation to Table 1. Pulses P1, P2 and P3 in the filter input signal INPUT do not appear in the filter output signal OUTPUT because they have pulse widths less than the predetermined pulse width. Pulses in the filter input signal INPUT having pulse widths exceeding the predetermined pulse width are passed and delayed by the delay time Td1 of the delay unit 15, and thus appear in the filter output signal OUTPUT. In other words, as discussed above, the pulse width filter passes pulses having a pulse width equal to or greater than a predetermined width and blocks pulses having a pulse width less than the predetermined width, thus generating a filter output signal OUTPUT in the form of a pulse train that includes only the passed pulses.

Referring again to FIG. 1, the data synchronization circuit further includes a demodulator that receives the filter output signal OUTPUT and the clock signal CLK and generates the data output signal DO. The filter output signal OUTPUT may have the form of a pulse train. Although the demodulator is shown as an XOR gate in FIG. 1, other devices capable of demodulating a data signal and clock signal in accordance with the techniques described herein may also be used. For example, the demodulator function can be implemented using another device or combination of devices that perform a boolean XOR or XNOR operation.

Now referring to FIG. 4, a timing diagram illustrating the operation of the data synchronization circuit 10 shown in FIG. 1 will be described. The modulator 13, pulse width filter 12, and demodulator 14 are connected as shown in FIG. 1. The data input signal DI, "00010011", is input into the modulator 13 with a phase that leads the clock signal CLK as shown in (a). The filter input signal INPUT of node A which is the result of an exclusive OR operation (XOR1) of the data input signal DI and the clock signal CLK has pulses of multiple widths. The pulse width filter 12, which receives the filter input signal INPUT of node A, passes pulses having a pulse width exceeding the predetermined pulse width and blocks pulses P1, P2 and P3 having a pulse width less than the predetermined pulse width as described above. As a result, the output of the pulse width filter 12 is shown as filter output signal OUTPUT of node B. The filter output signal OUTPUT of node B, as shown in FIG. 4, is the output obtained from the pulse width filter 12 when the delay time Td1 of the pulse width filter 12 is not considered.

The data output signal DO, "00010011", which is the result of an exclusive OR operation (XOR2) of the filter output signal OUTPUT of node B and the clock signal CLK is synchronized with the clock signal CLK as shown in (b). Accordingly, the data synchronization circuit 10 synchronizes the data input signal DI, which has a phase that leads the clock signal CLK, with the clock signal CLK to provide the data output signal DO. The data synchronization circuit 10 may also synchronize a data input signal DI having a phase that lags the clock signal CLK with the clock signal CLK to provide the data output signal DO.

Figure 4:
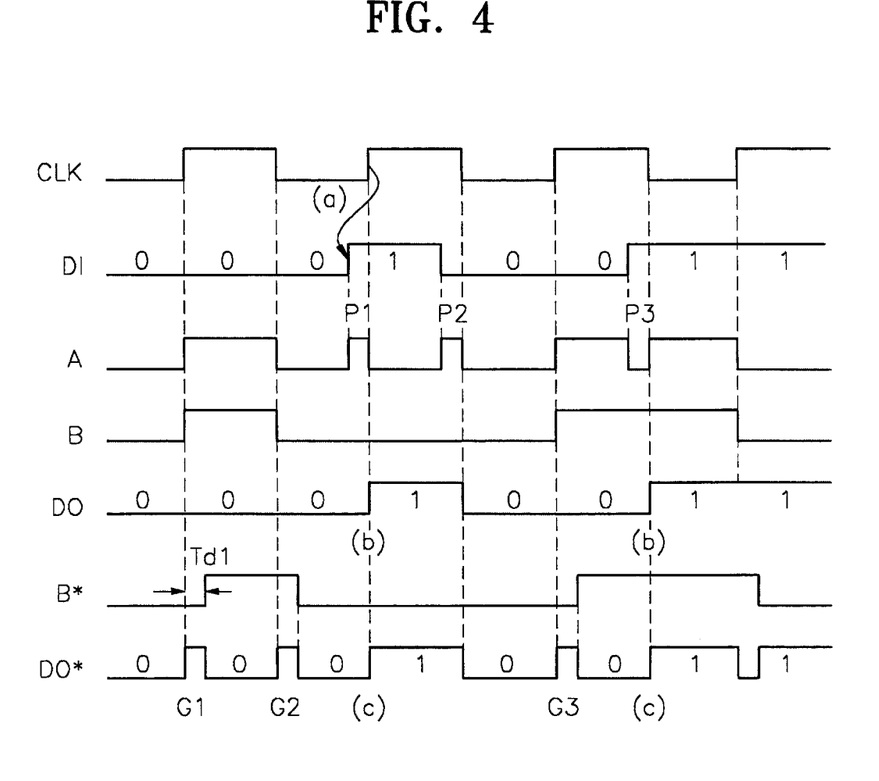
FIG. 4 is a timing diagram illustrating the operation of the data synchronization circuit shown in FIG. 1.

When the delay time Td1 of the pulse width filter 12 is considered in the data synchronization circuit 10, the filter output signal OUTPUT of node B is delayed by the delay time Td1 and appears as B* in FIG. 4. Data output signal DO*, "00010011", which is the result of an exclusive OR operation (XOR2) of the filter output signal of B* and the clock signal CLK, is in synchronization with the clock signal CLK as shown in (c). As shown in FIG. 4, DO* contains glitches G1, G2 and G3 that occur between consecutive 0 data This problem may be solved by including a time delay in the clock signal CLK, as discussed below with reference to FIGS. 5 and 6.

Figure 5:
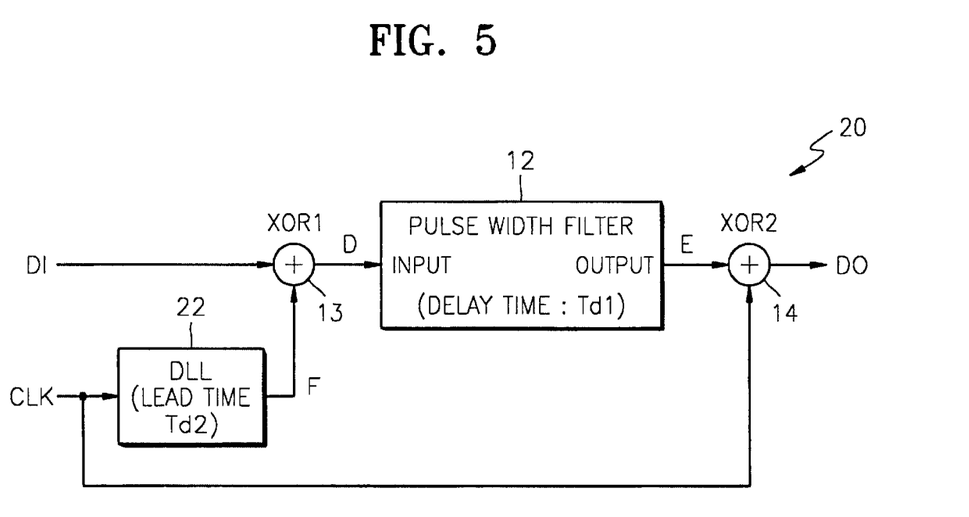
FIG. 5 is a schematic block diagram of a data synchronization circuit according to another embodiment of the present invention.

Now referring to FIG. 5, a data synchronization circuit 20 according to the an embodiment of the present invention that includes a delayed locked loop (DLL) 22 in addition to the data synchronization circuit 10 of FIG. 1 will be described. The DLL 22 shifts a clock signal CLK by a predetermined lead time Td2 and provides a lead clock signal whose phase leads that of the clock signal CLK. To compensate for the delay time Td1 of the pulse width filter 12, the clock signal CLK may be input to the DLL 22 to generate a clock signal at a node F whose phase leads that of the clock signal CLK by the delay time Td2. The lead time Td2 of the DLL 22 may be set to be the same as the delay time Td1 of the pulse width filter 12. The signal of node F may be input into the modulator 13 like the clock signal CLK of FIG. 1.

Figure 6:
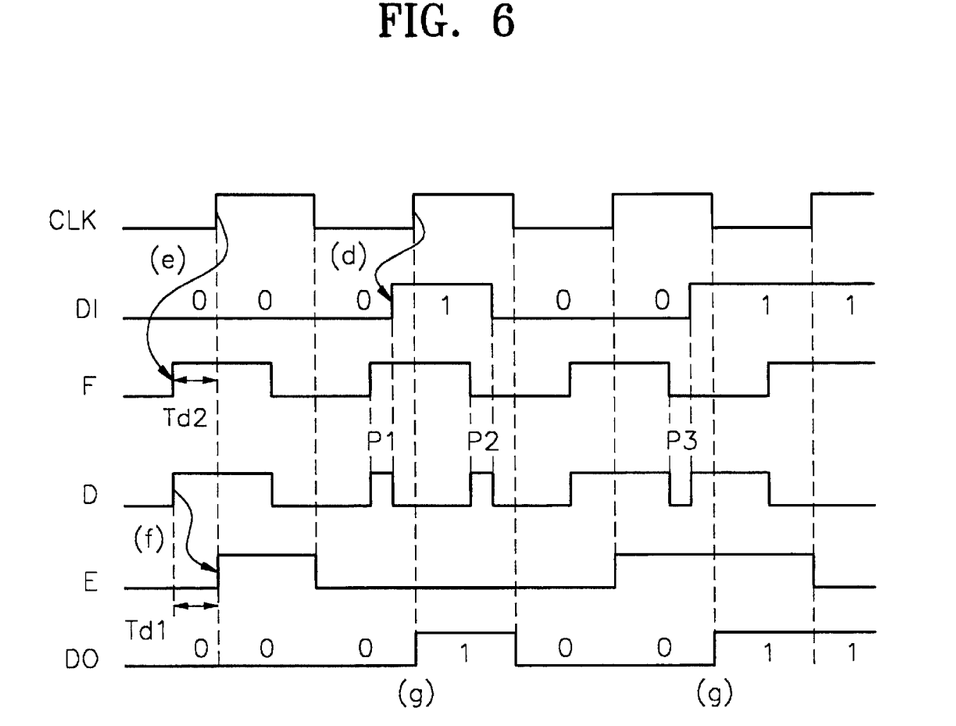
FIG. 6 is a timing diagram illustrating the operation of the data synchronization circuit shown in FIG. 5.

Referring now to FIG. 6, a timing diagram illustrating the operation of the data synchronization circuit 20 shown in FIG. 5 will be described. The data input signal DI, "00010011", may be input into the modulator 13 with a phase that leads the clock signal CLK as shown in (d). The clock signal CLK is input to the DLL 22 to generate the signal at node F, which leads the clock signal CLK in phase by the lead time Td2 as shown in (e). The filter input signal INPUT at node D which is the result of an exclusive OR operation (XOR1) of the data input signal DI and the signal of node F has pulses of multiple widths. The pulse width filter 12, which receives the filter input signal INPUT of node D, generates a signal which is delayed by the delay time Td1 and outputs the filter output signal OUTPUT to node E as shown in (f). The pulse width filter 12 passes the pulses having a pulse width exceeding the predetermined pulse width and blocks pulses P1, P2 and P3 having a pulse width less than the predetermined pulse width as described above. The data output signal DO, "00010011", which is the result of an exclusive OR operation (XOR2) of the filter output signal OUTPUT of node E and the clock signal CLK is synchronized with the clock signal CLK.

Accordingly, the data synchronization circuit 20 synchronizes the data input signal DI, whose phase leads that of the clock signal CLK, with the clock signal to provide the data output signal DO. The glitches that were present in the data output signal DO of the data synchronization circuit 10 shown in FIG. 1 are no longer present in the data output signal DO of the data synchronization circuit 20 shown in FIG. 5.

Now referring to FIG. 7, a diagram of a data synchronization circuit according to a and embodiment of the present invention having a delay control circuit will be described. When the pass width of the pulse width filter 12 of FIG. 5 is, for example, a quarter of one cycle of the clock signal CLK, and the phase of the data input signal DI leads or lags that of the clock signal CLK, normal data input signals DIs not exceeding the pass width may be ignored. The phase of the data input signal DI leads or lags that of the clock signal CLK when the delay time Td1 is longer than the pass width of the pulse width filter 12. The data synchronization circuit 30 of FIG. 7 including variable delay units whose delay times are set to a quarter of the clock (CLK) cycle may solve this problem.

The data synchronization circuit 30 includes an input buffer 31, a clock buffer 32, a modulator 13, a variable delay unit 33, a phase delay unit 34, a phase detector 35, a charge pump 36, a pulse width filter 37, and a demodulator 14. The elements of the data synchronization circuit 30 are connected as shown in FIG. 7.

Figure 7:
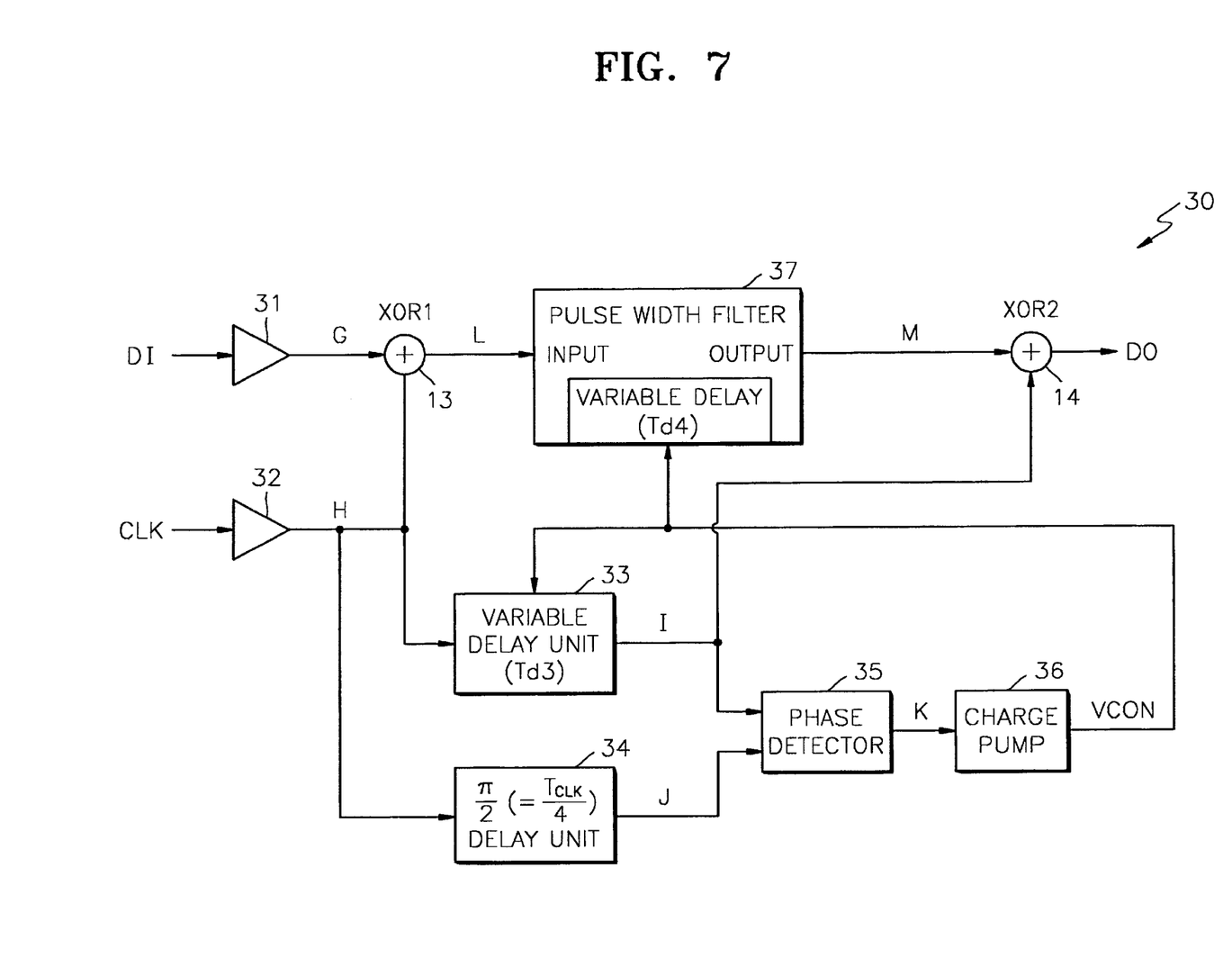
FIG. 7 is a schematic block diagram of a data synchronization circuit according to yet another embodiment of the present invention.
Figure 8:
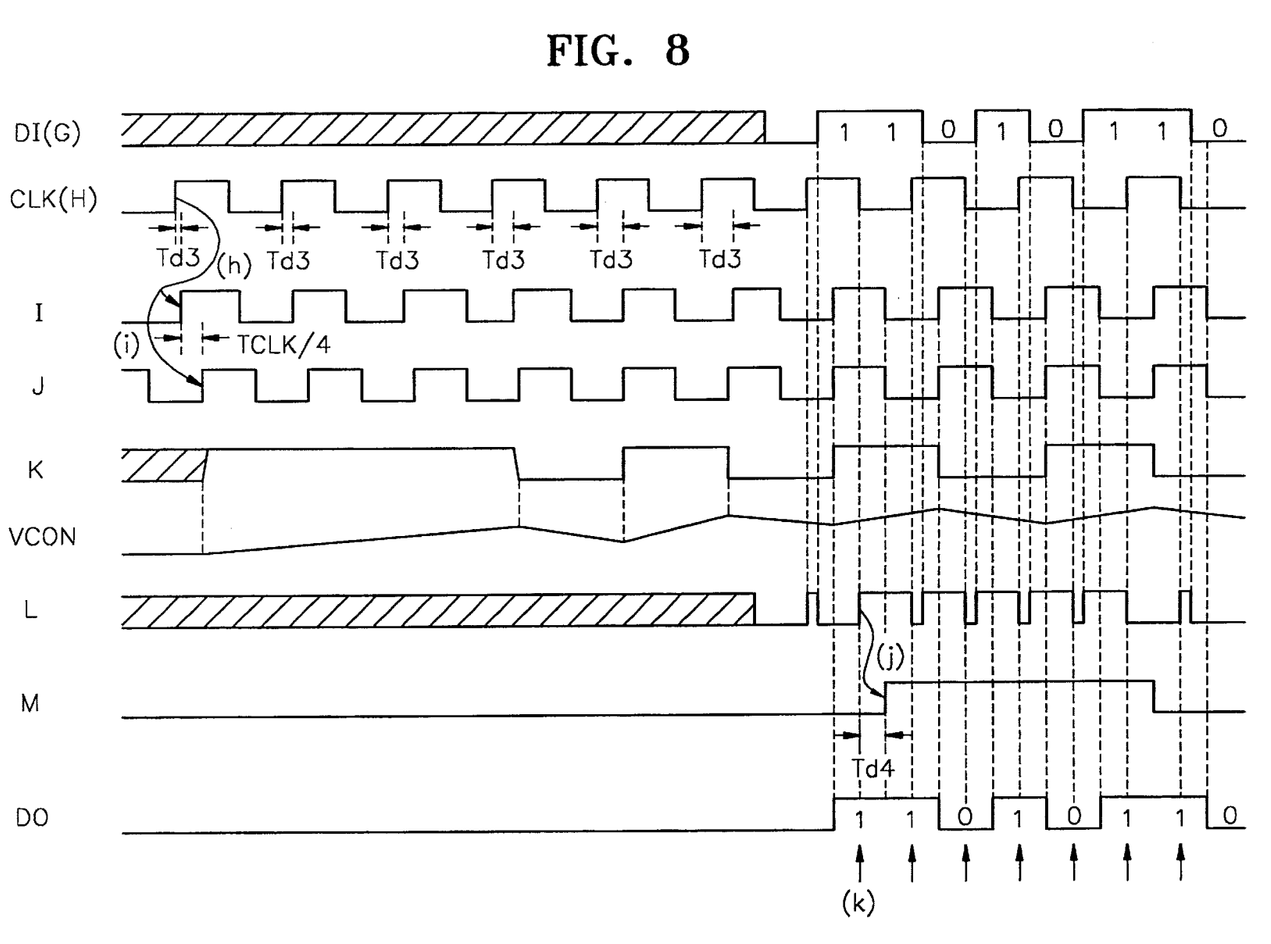
FIG. 8 is a timing diagram illustrating the operation of the data synchronization circuit shown in FIG. 7.
Figure 9:
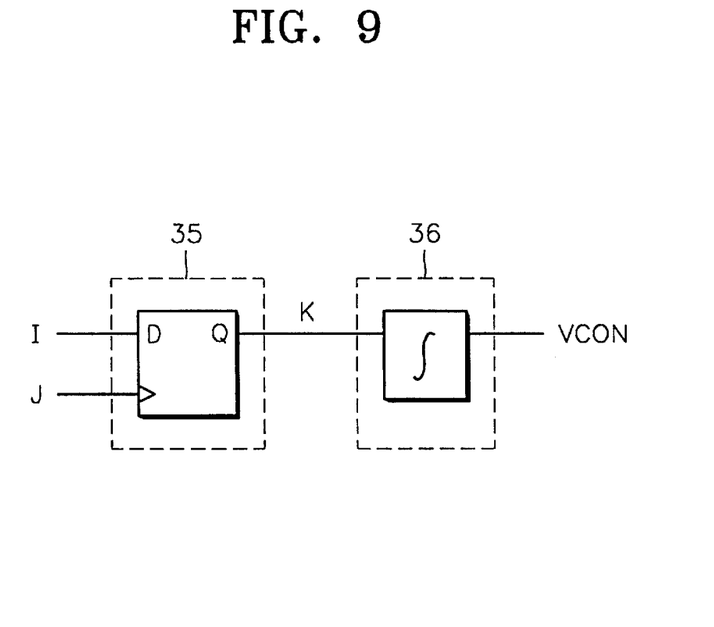
FIG. 9 is a schematic block diagram of the phase detector and the charge pump of the data synchronization circuit shown in FIG. 7.

Referring to FIG. 8, a timing diagram illustrating the operation of the data synchronization circuit 30 shown in FIG. 7 will now be described. The clock signal CLK is passed through the clock buffer 32 and appears at node H. The signal of node H is passed through the variable delay unit 33 which generates the signal of node I and varies the delay time Td3 according to the control voltage VCON of the charge pump 36 as shown in (h). The signal of node H is also passed through the phase delay unit 34 which generates the signal of node J which is delayed by a quarter of the cycle of the clock signal CLK, TCLK/4 as shown in (i). The signals of nodes I and J are input to the phase detector 35 which is shown in FIG. 9. The phase detector 35 of FIG. 9 is an example of a phase detector realized as a D-flip flop. The output of the phase detector 35 is a control signal and appears at node K of FIG. 8.

The control signal of node K is provided to the charge pump 36 which may be realized as an integrator as shown in FIG. 9. Generally, the charge pump 36 includes a capacitor (not shown) that is charged or discharged according to the control signal of node K to provide an control voltage VCON. The charge pump 36 charges the capacitor when the control signal of node K is at a "high" level and increases the control voltage VCON accordingly. The charge pump 36 discharges the capacitor when the control signal of node K is at a "low" level and decreases the control voltage VCON accordingly. The control voltage VCON of the charge pump 36 is shown in the timing diagram of FIG. 8.

Referring again to FIGS. 7 and 8, the variable delay unit 33 increases the delay time Td3 for the clock signal CLK in response to the increasing control voltage VCON of the charge pump 36 and decreases the delay time Td3 in response to the decreasing control voltage VCON of the charge pump 36, thereby generating and outputting to node I a signal having variable delay time. Finally, the delay time Td3 of the variable delay unit 33 is set to a quarter of the cycle of the clock signal CLK, TCLK/4.

The data input signal DI is then passed through the input buffer 31 and appears at node G. The data input signal DI, "11010110", is received with a phase that lags the clock signal CLK. The modulator 13, realized as a 2-input exclusive OR gate XOR1 in FIG. 7, receives the signals of nodes G and H and outputs the filter input signal INPUT to node L. The pulse width filter 37 receives the filter input signal INPUT of node L and adjusts the delay time Td4 according to a control voltage, i.e., the control voltage VCON of the charge pump 36 as shown in (j).

Figure 10:
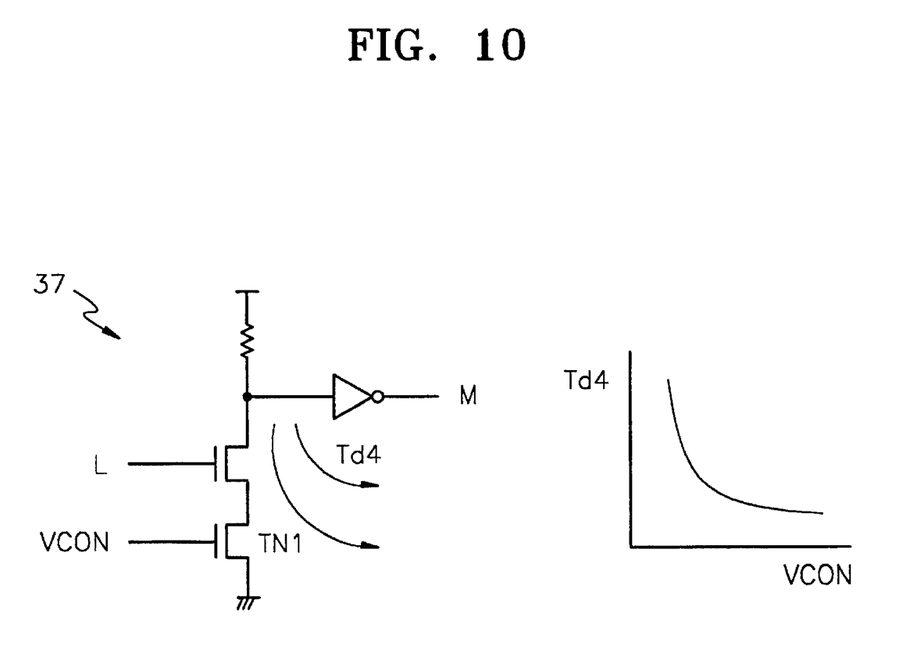
FIG. 10 is a circuit diagram that illustrates a method for varying the delay time of the pulse width filter according to data synchronization circuit shown in FIG. 7.

The delay time Td4 of the pulse width filter 37 of FIG. 7 varies according to the control voltage VCON of the charge pump 36, unlike the delay time Td1 of the delay unit 15 of the pulse width filter 12 of FIG. 2 which is fixed. A method of adjusting the delay time Td4 of the pulse width filter 37 is shown in FIG. 10.

Now referring to FIG. 10, a circuit diagram that illustrates a method for varying the delay time of the pulse width filter 37 according to the data synchronization circuit 30 shown in FIG. 7 will be described. In response to the increasing control voltage VCON of the charge pump 36, a large current flows through a transistor TN1, and thus the filter input signal INPUT of node L is quickly transported to node M. In response to the decreasing control voltage VCON of the charge pump 36, a small current flows through the transistor TN1, and thus the filter input signal INPUT of node L is slowly transported to node M. As shown in the graph of FIG. 10, the delay time Td4 becomes shorter as the control voltage VCON of the charge pump 36 increases, and the delay time Td4 becomes longer as the control voltage VCON of the charge pump 36 decreases. Accordingly, the delay time Td4 of the pulse width filter 37 is also set to a quarter of the cycle of the clock signal CLK, TCLK/4.

The pulse width filter 37 of FIG. 7 delays the filter input signal INPUT at node L by the delay time Td4 varied according to the control voltage VCON of the charge pump 36, i.e., a quarter of the cycle of the clock signal CLK, TCLK/4. Pulse width filter 37 passes pulses having a pulse width exceeding a predetermined pulse width and blocks pulses P1, P2 and P3, which have a pulse width less than the predetermined pulse width.

The center of each data window of the data output signal DO, "11010110", which is the output of the demodulator, realized as a 2-input exclusive OR gate XOR2 receiving the signals of nodes M and I, coincides with the edge of the clock signal CLK as shown in (k). In this embodiment, the data synchronization circuit 30 receives the data input signal DI, which has a phase that lags the clock signal CLK, and provides the data output signal DO in which the center of each data window coincides with the edge of the clock signal CLK. Accordingly, due to the data synchronization circuit 30 of this embodiment, enough time for data setup/hold can be ensured for the data output signal DO since the edge of the clock signal CLK coincides with the center of each data window.

Figure 11:
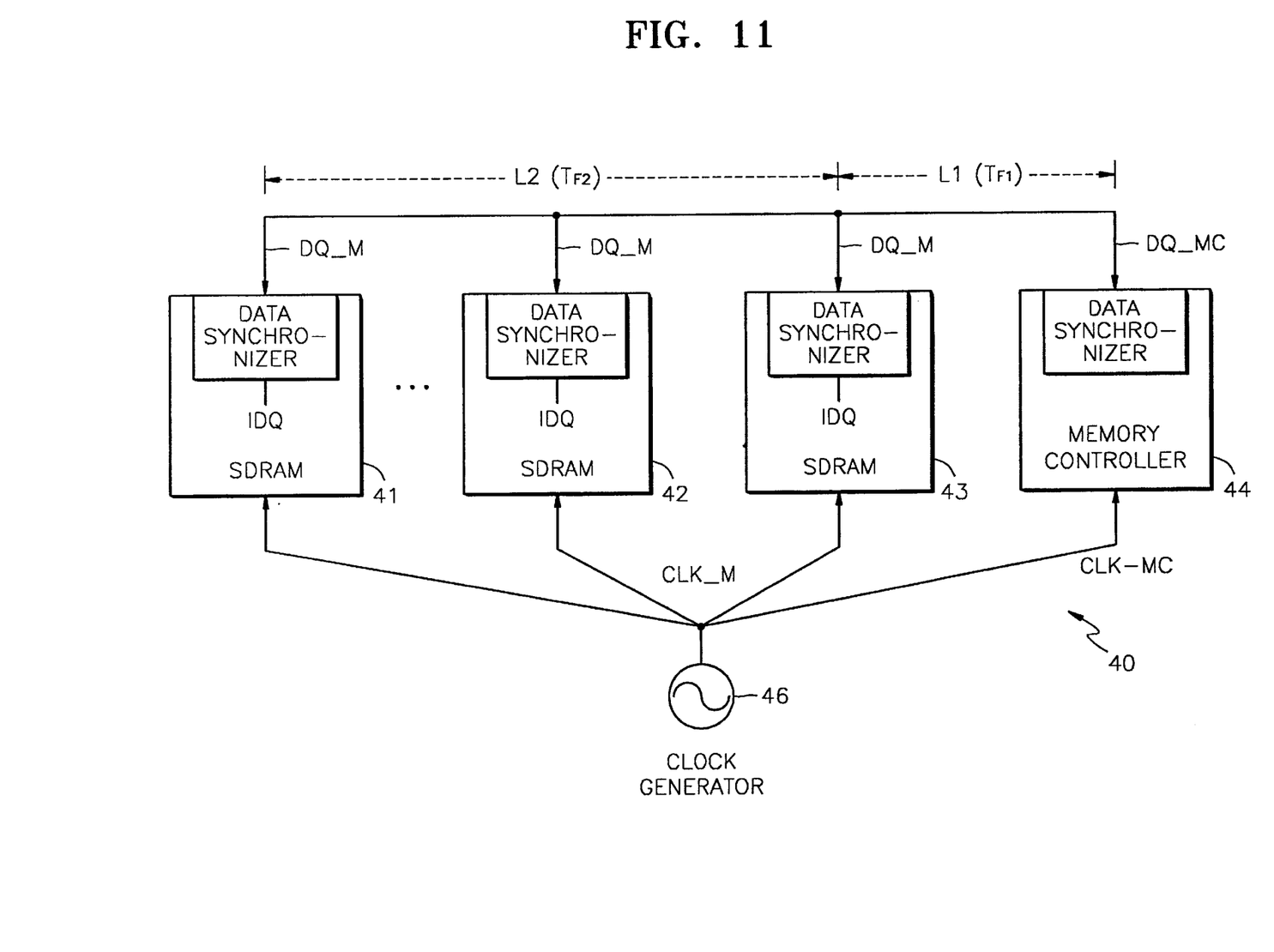
FIG. 11 is a schematic block diagram that illustrates an example of providing the data synchronization circuits of the present invention to semiconductor integrated circuits on a printed circuit board.

Now referring to FIG. 11, a memory interface method for a memory including a data synchronization circuit according to the present invention will be described. A memory interface 40 includes a plurality of memory devices, for example, synchronous DRAMs 41, 42 and 43, and a memory controller 44 for controlling the synchronous DRAMs 41, 42 and 43. Each of the synchronous DRAMs 41, 42 and 43 and the memory controller 44 includes a data synchronization circuit and transmits/receives data synchronized with a clock signal CLK through a DQ line. It will be understood by those having skill in the art that a synchronous DRAM is described as an example in this specification, but the present invention can be applied to other synchronous semiconductor memory devices synchronized with a clock signal, for example, Rambus DRAMs.

Assuming that the distance between the memory controller 44 and the nearest synchronous DRAM 43 is L1, corresponding to signal fight time $T_{F1}$, and the distance between the memory controller 44 and the farthest synchronous DRAM 41 is L2, corresponding to signal flight time $T_{F2}$, data provided from the memory controller 44 may be received by each of the synchronous DRAMs 41, 42 and 43 at times $T_{F1}$ through $T_{F1}+T_{F2}$ after the clock signal CLK.

Figure 12:
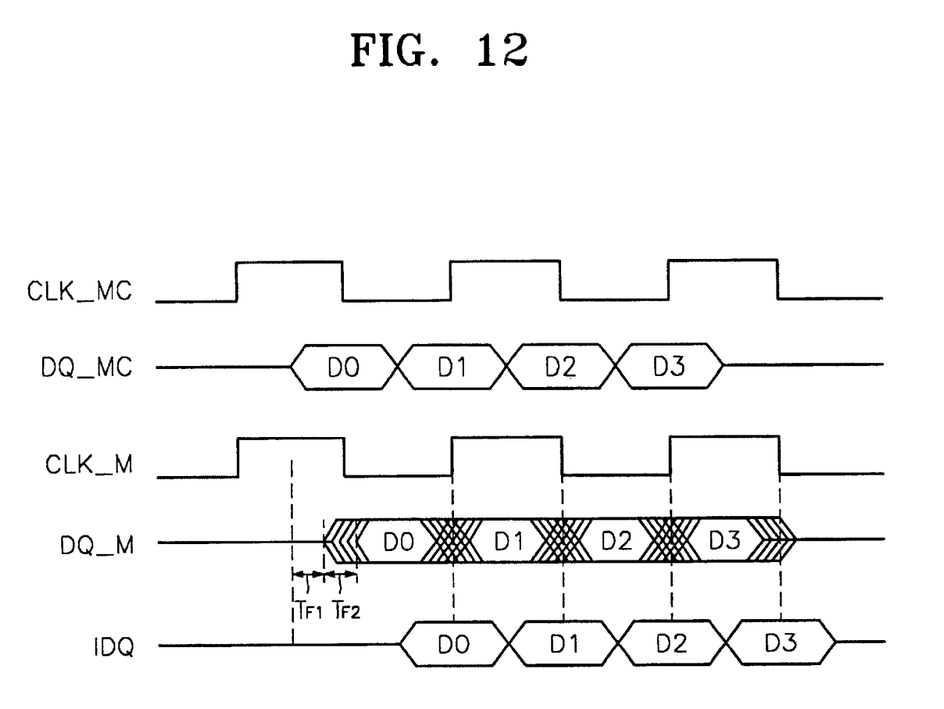
FIG. 12 is a timing diagram illustrating the operation of the circuit shown in FIG. 11.

Now referring to FIG. 12, the signals of the memory interface of memory devices including a data synchronization circuit will be described. Assuming that a clock signal CLK_MC provided by the clock generator 46 to the memory controller 44 is in phase with a clock signal CLK_M provided by the clock generator 46 to each of the synchronous DRAMs 41, 42 and 43, the center of each valid window of data DQ_MC, which is provided by the memory controller 44 and appears on the DQ line, coincides with the edge of the clock signal CLK_MC. However, when the data DQ_MC arrives at each of the synchronous DRAMs 41, 42 and 43, the data DQ_MC is delayed by $T_{F1}$ through $T_{F1}+T_{F2}$ and appears as data DQ_ on the DQ line connected to each synchronous DRAM 41, 42 or 43.

The delayed data DQ_M is synchronized with the clock signal CLK_M by a data synchronization circuit included in each synchronous DRAM 41, 42 or 43 such that the center of each valid data window is made to coincide with the edge of the clock signal CLK_M, and then provided to an internal DQ line IDQ of each synchronous DRAM 41, 42 or 43. Accordingly, a data synchronization circuit of the present invention allows the internal DQ line IDQ of each synchronous DRAM 41, 42 or 43, which is synchronized with the clock signal CLK_MC or CLK_M, to be used even in a memory interface mode.

As described above, a data synchronization circuit according to embodiments of the present invention synchronizes a data signal with a clock signal without requiring the use of a transmission clock signal Tclk and a reception clock signal Rclk, or a data strobe signal. Therefore, the data synchronization circuit of the present invention does not require additional circuits to solve the problem of controlling the timing between a master clock signal and a transmission clock signal Tclk or a reception clock signal Rclk, or a data strobe signal, and thus additional circuits may not be required, thereby reducing the cost of a device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A data synchronization circuit, comprising:
   a modulator that generates a filter input signal as a first pulse train having pulses of nonequivalent widths, in response to a first clock signal and a data input signal that is out of phase relative to the first clock signal;
   a pulse width filter that generates a filter output signal as a second pulse train, in response to the filter input signal; and
   a demodulator that generates a data output signal as a true or complementary time corrected version of the data input signal, in response to the filter output signal and a second clock signal.

2. The circuit of claim 1, wherein the first clock signal and the second clock signal are in phase with each other.

3. The circuit of claim 2, wherein the data output signal is in phase with the first and second clock signals.

4. The circuit of claim 3, wherein said pulse width filter comprises:
   a delay unit that generates a delayed filter input signal from the filter input signal; and
   a filter circuit that generates the filter output signal from the filter input signal and the delayed filter input signal.

5. The circuit of claim 4, wherein the delay unit comprises an inverter chain.

6. The circuit of claim 4, wherein the filter circuit comprises:
   a first filtering device that performs a boolean NAND operation on the filter input signal and the delayed filter input signal;
   a second filtering device that performs a boolean OR operation on the filter input signal and the delayed filter input signal;
   a third filtering device that performs a boolean NAND operation on an output of the first filtering device and an output of a fourth filtering device; and
   the fourth filtering device that performs a boolean NAND operation on an output of the second filtering device and an output of the third filtering device.

7. The circuit of claim 6, wherein the first filtering device comprises a NAND gate, wherein the second filtering device comprises an OR gate, and wherein the third and fourth filtering devices comprise NAND gates.

8. The circuit of claim 1, wherein the modulator and the demodulator perform boolean XOR operations.

9. The circuit of claim 8, wherein the modulator and the demodulator comprise XOR gates.

10. The circuit of claim 1, further comprising a delay locked loop that generates the first clock signal that is a shifted version of the second clock signal, wherein the phase of the first clock signal leads the phase of the second clock signal.

11. The circuit of claim 10, wherein the data output signal is in phase with the second clock signal.

12. The circuit of claim 11, wherein the pulse width filter includes a delay unit.

13. The circuit of claim 12, wherein the delay provided by the delay unit is equivalent to the shift provided by the delay locked loop.

14. The circuit of claim 1, wherein the second clock signal comprises a delayed version of the first clock signal.

15. The circuit of claim 14, wherein an edge of the first clock signal is in phase with the midpoint of the data output signal.

16. The circuit of claim 15, further comprising:
   a first input buffer that receives the data input signal and provides the data input signal to the modulator;
   a second input buffer that receives the first clock signal and provides the first clock signal to the modulator, a variable delay unit, and a delay unit; and
   a delay control circuit that generates the second clock signal and a control voltage from the first clock signal.

17. The circuit of claim 16, wherein said delay control circuit comprises:
   the variable delay unit that generates the second clock signal in response to the control voltage;
   the delay unit that generates a delayed version of the first clock signal;
   a phase detector that generates a control signal in response to the second clock signal and the delayed version of the first clock signal; and
   a charge pump that generates the control voltage in response to the control signal.

18. The circuit of claim 17, wherein said pulse width filter comprises a delay that is responsive to the control voltage of the charge pump.

19. The circuit of claim 18, wherein the delay of the pulse width filter increases as the control voltage decreases and decreases as the control voltage increases.

20. The circuit of claim 17, wherein said delay unit delays the first clock signal by ¼ of a period of the first clock signal.

21. The circuit of claim 17, wherein the charge pump comprises an integrator.

22. The circuit of claim 17, wherein said charge pump comprises a capacitor that is responsive to the control signal such that the charge pump generates a large control voltage when the control signal is high and generates a small control voltage when the control signal is low.

23. The circuit of claim 17, wherein the phase detector comprises a D flip flop.

24. A multi-bank memory device, comprising:

a data bus;

a memory controller electrically coupled to said data bus;

a first memory bank electrically coupled to said data bus at a first point thereon, said first memory bank comprising:

a data synchronization circuit that is responsive to a global clock signal and comprises:

a modulator that generates a filter input signal as a first pulse train having pulses of nonequivalent widths, in response to a first clock signal that is derived from the global clock signal and a first data input signal that is provided on said data bus and is out of phase relative to the global clock signal by a first phase amount;

a pulse width filter that generates a filter output signal as a second pulse train, in response to the filter input signal; and a demodulator that generates a data output signal as a true or complementary time corrected version of the first data input signal, in response to the filter output signal and a second clock signal; and a second memory bank electrically coupled to said data bus at a second point thereon, said second memory bank comprising:

a data synchronization circuit that is responsive to the global clock signal and comprises:

a modulator that generates a filter input signal as a first pulse train having pulses of nonequivalent widths, in response to a third clock signal that is derived from the global clock signal and a second data input signal that is provided on said data bus and is out of phase relative to the global clock signal by a second phase amount that is greater than the first phase amount;

a pulse width filter that generates a filter output signal as a second pulse train, in response to the filter input signal; and a demodulator that generates a data output signal as a true or complementary time corrected version of the second data input signal, in response to the filter output signal and a fourth clock signal.

25. The circuit of claim 24, wherein the first, second, third and forth clock signals are in-phase with the global clock signal.

26. The circuit of claim 24, wherein the first and the third clock signals are delayed versions of the global clock signal and the second and the fourth clock signals are in-phase with the global clock signal.

27. The circuit of claim 24, wherein the second and forth clock signals are delayed versions of the global clock signal and the first and the third clock signals are in-phase with the global clock signal.

* * * * *